United States Patent [19]

Ito et al.

[11] Patent Number: 5,021,859
[45] Date of Patent: Jun. 4, 1991

[54] HIGH-FREQUENCY AMPLIFYING SEMICONDUCTOR DEVICE

[75] Inventors: Takahiro Ito, Kawasaki; Bunshiro Yamaki, Fujisawa; Yoshio Yamamoto, Yokohama, all of Japan

[73] Assignee: Kabushiki Kaisha Toshiba, Kawasaki, Japan

[21] Appl. No.: 436,056

[22] Filed: Nov. 9, 1989

[30] Foreign Application Priority Data

Nov. 10, 1988 [JP] Japan .................. 63-284772

[51] Int. Cl.⁵ .......................... H01L 27/02
[52] U.S. Cl. ..................... 357/43; 357/46; 357/47; 357/40; 357/41; 357/90
[58] Field of Search ........... 357/43, 46, 42, 90, 357/40, 41, 47, 48

[56] References Cited

U.S. PATENT DOCUMENTS 4,831,430  5/1989  Umeji ................. 357/90 X

FOREIGN PATENT DOCUMENTS 62-122307  6/1987  Japan .

OTHER PUBLICATIONS

Richard S. Muller and Theodore I Kamins *Device Electronics for Integrated Circuits* J. Wiley 1986, pp. 33–35.
S. M. Sze *Semiconductor Devices Physics and Technology* J. Wiley 1985 p. 180.

*Primary Examiner*—Rolf Hille
*Assistant Examiner*—Roy Potter
*Attorney, Agent, or Firm*—Oblon, Spivak, McClelland, Maier & Neustadt

[57] ABSTRACT

In a high-frequency amplifying semiconductor device in which a MOS field effect transistor and a bipolar transistor are formed within the same wafer and a source electrode of the MOS field effect transistor is connected to a lead frame by a bonding wire, use is made of a wafer for fabricating the MOS field effect transistor and the bipolar transistor, in which on a semiconductor substrate of P++ type is formed a first epitaxial layer of P or P— type, a buried layer of N+ type is formed in the first epitaxial layer of the first conductivity type and a second epitaxial layer of P type is formed on the buried layer and the first epitaxial layer. The use of such a wafer, which has no P— type Si substrate, allows the source resistance of the MOS field effect transistor to be decreased. The high-frequency amplifying semiconductor device is improved in high-frequency gain and NF.

14 Claims, 6 Drawing Sheets

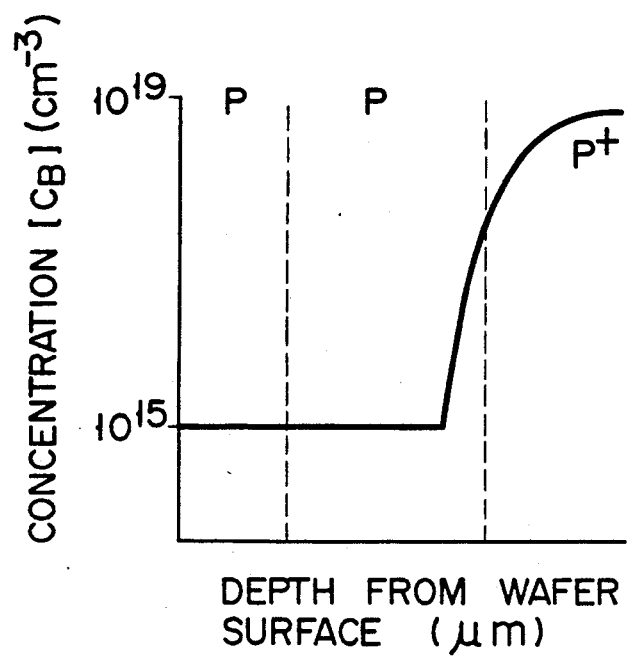
F I G. 7
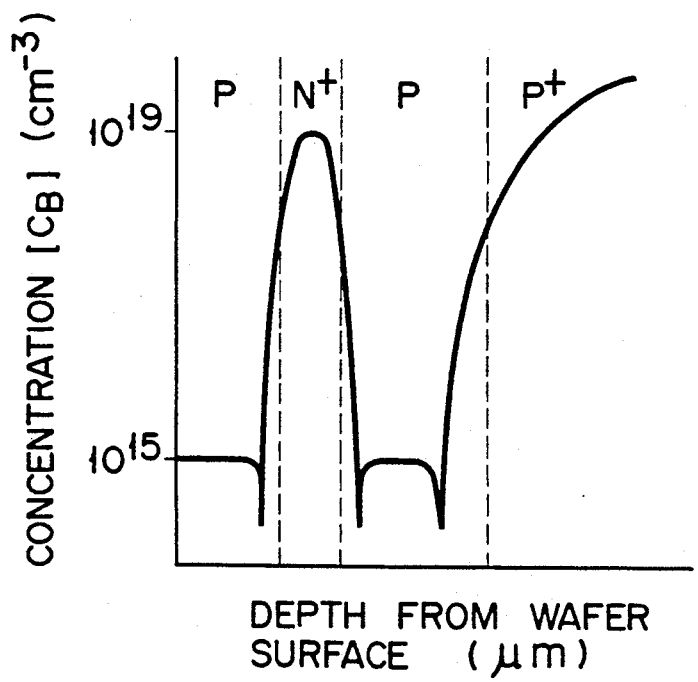
F I G. 8

HIGH-FREQUENCY AMPLIFYING SEMICONDUCTOR DEVICE

BACKGROUND OF THE INVENTION

1. Field of the Invention

The present invention relates to a high-frequency amplifying semiconductor device, in which a MOS (metal oxide semiconductor) field effect transistor and a bipolar transistor are formed within a semiconductor wafer, adapted for use with receivers such as TV, VTR and FM tuners.

2. Description of the Related Art

In a semiconductor device used in a high-frequency amplifier circuit of a tuner, a MOS field effect transistor FET and bipolar transistors are formed in the same substrate such that MOS field effect transistor FET and Darlington-connected bipolar transistors Tr1 and Tr2 are cascade-connected via a diode Di as shown in FIG. 6. Reference numeral 51 denotes an input terminal, 52 a ground terminal, 53 a control terminal, 54 an output terminal, reference character G denotes a gate, D a drain, S a source, E1 and E2 emitters, C1 and C2 collectors, and B1 and B2 bases. As can be seen from a sectional view of the semiconductor device of FIG. 1, use is made of a wafer formed of a P− type Si substrate 1, a P type epitaxial layer 2 and a N+ type collector buried layer 11. In FIG. 1, reference numeral 3 denotes the base region (N type) of an input protection diode, 4, 5 P+ type emitter regions of the input protection diode, 6 a P+ type region of a diode capacitor, 7 an N+ type region of the diode capacitor, 8 an N+ type source region of a MOS field effect transistor FET, 9 an N+ type drain region of the MOS field effect transistor FET, 10 a gate oxide film of the MOS field effect transistor FET, 12 a N type collector region of bipolar transistors TR1, Tr2, 14, 17 P type active base regions of bipolar transistors Tr1, Tr2, 15, 18 P+ type inactive base regions of bipolar transistors Tr1, Tr2, 16, 19 N+ type emitter regions of bipolar transistors Tr1, Tr2, 20 a protection oxide film, 21, 22 emitter electrodes of the input protection diode, 23 a polycrystalline semiconductor with no impurities, 24 a polycrystalline semiconductor heavily doped with N type impurities, 25 an upper electrode of the diode capacitor, 26 a wiring electrode between the source of the MOS field effect transistor FET and the diode capacitor, 27 a gate electrode of the MOS field effect transistor FET, 28 a wiring electrode between the drain of the MOS field effect transistor FET and the emitter of the bipolar transistor Tr1, 29 a wiring electrode between the emitter of bipolar transistor Tr2 and the base of bipolar transistor Tr1, 30 a base electrode of bipolar transistor Tr2 and 31 a collector electrode of bipolar transistor Tr2. Those various elements construct the input protection diode, the diode capacitor, the MOS field effect transistor FET and bipolar transistors Tr1 and Tr2.

To obtain a high withstand voltage at the collectors of bipolar transistors Tr1 and Tr2 in the semiconductor device of FIG. 1, N+ type collector buried layer 11 is formed in P− type Si substrate 1 and P type epitaxial layer 2 is formed on the buried layer. With such a structure, the source resistance of the MOS field effect transistor FET formed on the same substrate as bipolar transistors Tr1 and Tr2 increases at high frequencies. This is due to the following reason. The source current of the MOS field effect transistor FET flows through a path extending from the source of the FET and electrode 26 of the diode capacitor to a lead frame via a bonding wire and a vertical path extending from the source of the FET and electrode 26 of the diode capacitor to P− type Si substrate 1 via P+ type region 6 of the diode capacitor, P type epitaxial layer 2 and P− type Si substrate 1. An increase in the source resistance results from the existence of P− type Si substrate 1 in the vertical current path. An increase in the source resistance causes a decrease in high-frequency gain and an increase in noise figure (NF). At high frequencies, current will flow through the vertical current path because the bonding wire exhibits high inductance to impede the current flow.

SUMMARY OF THE INVENTION

In a high-frequency amplifying semiconductor device in which a MOS field effect transistor and a bipolar transistor are formed within the same wafer and a source electrode of the MOS field effect transistor is connected to a lead frame by a bonding wire, use is made of a wafer for fabricating the MOS field effect transistor and the bipolar transistor, in which on a semiconductor substrate of a first conductivity type which contains impurities at a high concentration is formed a first epitaxial layer of the first conductivity type which contains impurities at a concentration lower than that of the semiconductor substrate, a buried layer of a second conductivity type which contains impurities at a high concentration is formed in the first epitaxial layer of the first conductivity type and a second epitaxial layer of the first conductivity type which contains impurities at a lower concentration than the semiconductor substrate of the first conductivity type on the buried layer of the second conductivity type and the first epitaxial layer of the first conductivity type.

The use of such a wafer as described above allows the source resistance of the MOS field effect transistor to be decreased. The present invention can therefore provide a high-frequency amplifying semiconductor device which is improved in high-frequency gain and NF.

BRIEF DESCRIPTION OF THE DRAWINGS

FIG. 7 is a graph representing the impurity-concentration profile of the MOSFET section of the semiconductor device shown in FIG. 2; and FIG. 8 is a graph representing the impurity-concentration profile of the bipolar-transistor section of the semiconductor device illustrated in FIG. 2.

DETAILED DESCRIPTION OF THE PREFERRED EMBODIMENTS

Figure 2:
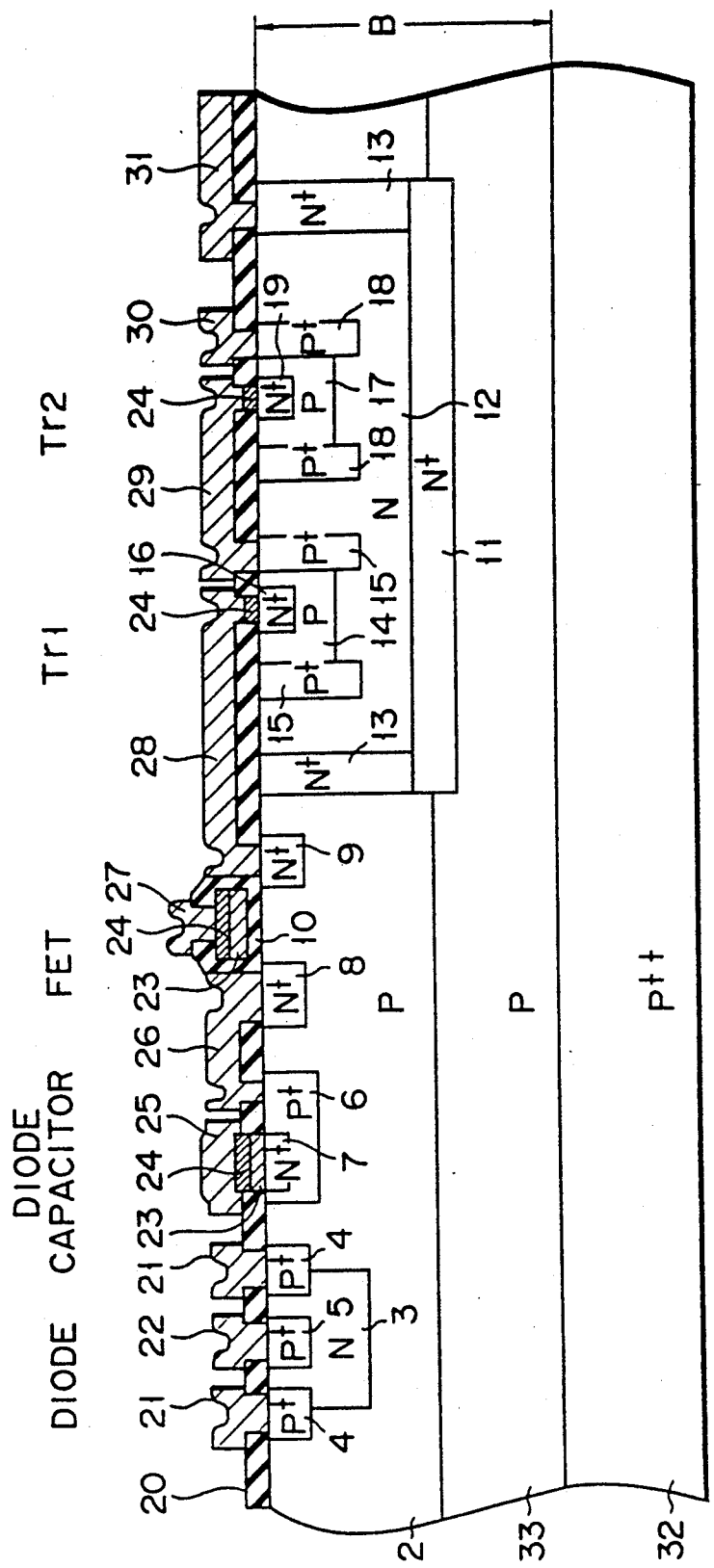
FIG. 2 is a sectional view of a first embodiment of a high-frequency amplifying semiconductor device according to the present invention.

FIG. 2 illustrates a first embodiment of a high-frequency amplifying semiconductor device for use with the high-frequency amplifier of a tuner in accordance with the present invention.

With the high-frequency amplifying semiconductor device of FIG. 2, a P type epitaxial layer 33 having a thickness of 25 $\mu$m to 35 $\mu$m and containing boron at a concentration of $1 \times 10^{15}$ cm$^{-3}$ ~ $6 \times 10^{15}$ cm$^{-3}$ is grown on a P type Si substrate 32 doped with boron at a concentration of $2 \times 10^{19}$ cm$^{-3}$. A collector N+ type buried layer 11 doped with antimony at a concentration of $5 \times 10^{19}$ cm$^{-3}$ is then formed and moreover an epitaxial layer 2 containing boron at a concentration of $2 \times 10^{15}$ cm$^{-3}$ is grown. Subsequently phosphorus is implanted through protection oxide layer 20 at 150 keV and at a dose of $5 \times 10^{12}$ cm$^{-3}$, at 50 keV and at a dose of $2 \times 10^{15}$ cm$^{-3}$ and at 60 keV and at a dose of $5 \times 10^{13}$ cm$^{-3}$ and then diffused for six hours at 1200° C. in N$_2$ gas, thereby forming collector N type region 12, collector N+ type region 13 and base region (N type) 3 of an input protection diode. Boron is implanted at 50 keV and at a dose of $2 \times 10^{15}$ cm$^{-3}$ and at 40 keV and at a dose of $5 \times 10^{13}$ cm$^{-3}$ and then diffused. P+ type inactive base regions 15 and 18, emitter P+ type regions 4 and 5 and P+ type region 6 of the diode capacitor are formed on the former implantation condition. P type active base regions 14 and 17 are formed on the basis of the latter implantation condition. Gate oxide layer 10 of the FET is formed and then a polycrystalline semiconductor 23 containing no impurities is formed. An emitter portion is opened by a photo engrave process (PEP) and then a polycrystalline semiconductor 24 doped with N-type impurities. Next, the PEP is performed and As is implanted at 40 keV and at a dose of $1 \times 10^{15}$ cm$^{-3}$. Then, annealing is carried out. After annealing, source N+ type region 8, drain N+ region 9 and N+ type emitter regions 16 and 19 of bipolar transistors Tr1 and Tr2 are formed. Subsequently, through openings of oxide film 20 are formed emitter electrodes of the protection diode, upper electrode 25 of the diode capacitor, wiring electrode 26 between the source of MOS field effect transistor FET and the diode capacitor, gate electrode 27 of MOS field effect transistor FET, wiring electrode 28 between the drain of MOS field effect transistor FET and the emitter of bipolar transistor Tr1, wiring electrode 29 between the emitter of bipolar transistor Tr2 and the base of bipolar transistor Tr1, base electrode 30 of bipolar transistor Tr2 and collector electrode 31 of bipolar transistor Tr2. Electrodes 22, 21 and 25 are wired to electrodes 27, 26 and 29, respectively. Wiring electrode 26 between the source of MOS field effect transistor FET and the diode capacitor is connected to the lead frame through a bonding wire so that current flows from source N+ type region 8 of MOS field effect transistor FET to the lead frame through wiring electrode 26 between the source of MOS field effect transistor FET and the bonding wire.

As described above, a MOS field effect transistor FET, bipolar transistors Tr1 and Tr2, an input protection diode and a diode capacitor can be formed within a common semiconductor substrate.

FIGS. 7 and 8 are graphs showing the impurity-concentration profiles of the MOSFET section and bipolar-transistor section (Tr1 and Tr2) of the high-frequency amplifying semiconductor device.

In the MOSFET section, it is desirable that first epitaxial layer 33 be as thin as possible and have as high an impurity concentration as possible, in order to reduce the resistance of the vertical current path. In the bipolar-transistor section (Tr1 and Tr2), however, if first epitaxial layer 33 is so thin and has so high an impurity concentration, the withstand voltages of bipolar transistors Tr1 and Tr2 will decrease too much. Therefore, those portions of first epitaxial layer 33, which are located in the MOSFET section and bipolar-transistor sections (Tr1, Tr2), have those impurity-concentration profiles shown in FIGS. 7 and 8, respectively, so that the vertical current path has sufficiently low resistance, and both transistors Tr1 and Tr2 have adequate withstand voltages.

Figure 3:
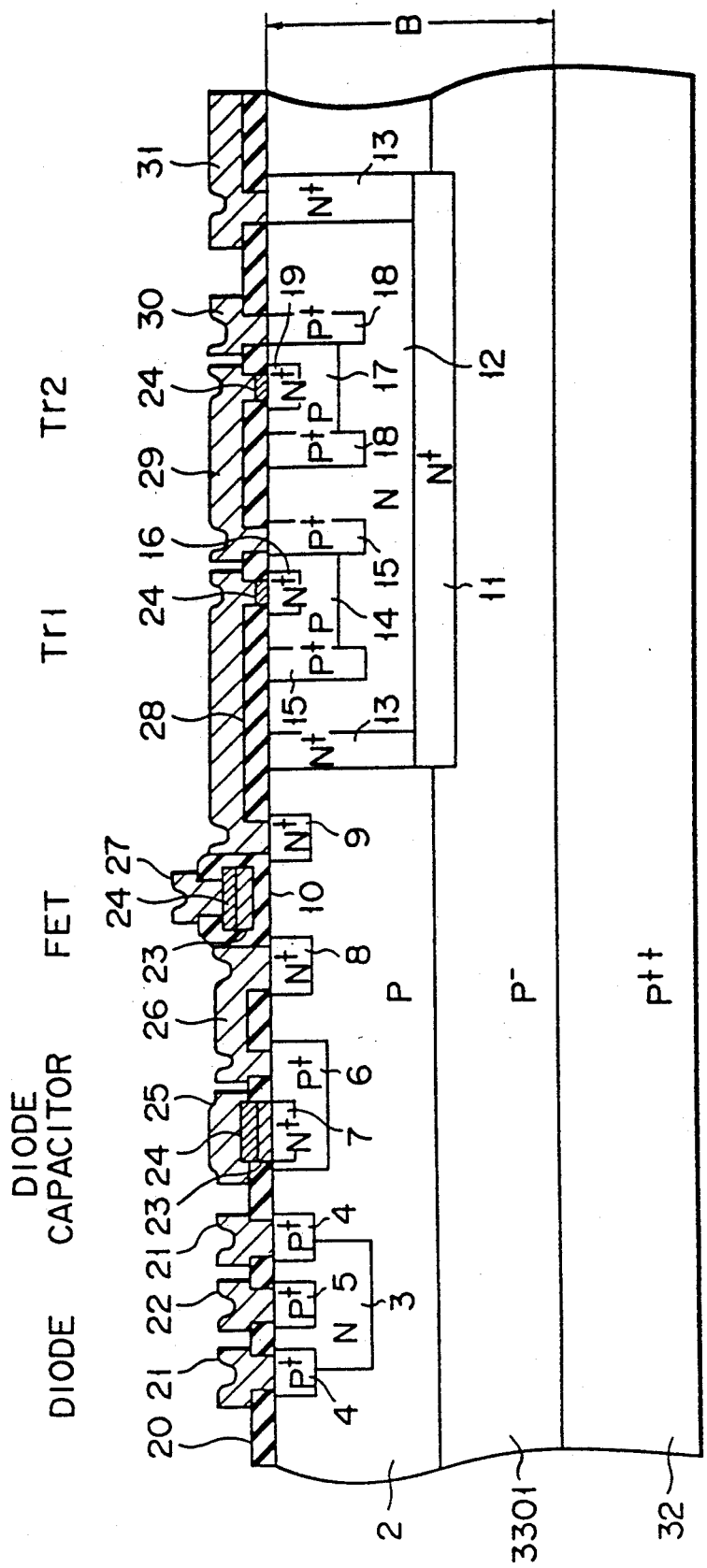
FIG. 3 is a sectional view of a second embodiment of the high-frequency amplifying semiconductor device of the present invention.

FIG. 3 illustrates a second embodiment of the present invention in which first epitaxial layer 3301 has an impurity concentration of $3 \times 10^{14}$ cm$^{-3}$ to $6 \times 10^{14}$ cm$^{-3}$ and a thickness of 20 to 30 $\mu$m, and second epitaxial layer 2 has an impurity concentration of $2 \times 10^{15}$ cm$^{-3}$ and a thickness of 5 $\mu$m. First epitaxial layer 3301 is a P$^-$ type layer the thickness of which is considerably small as compared to conventional Si substrate 1 and thus has little influence on current.

Figure 4:
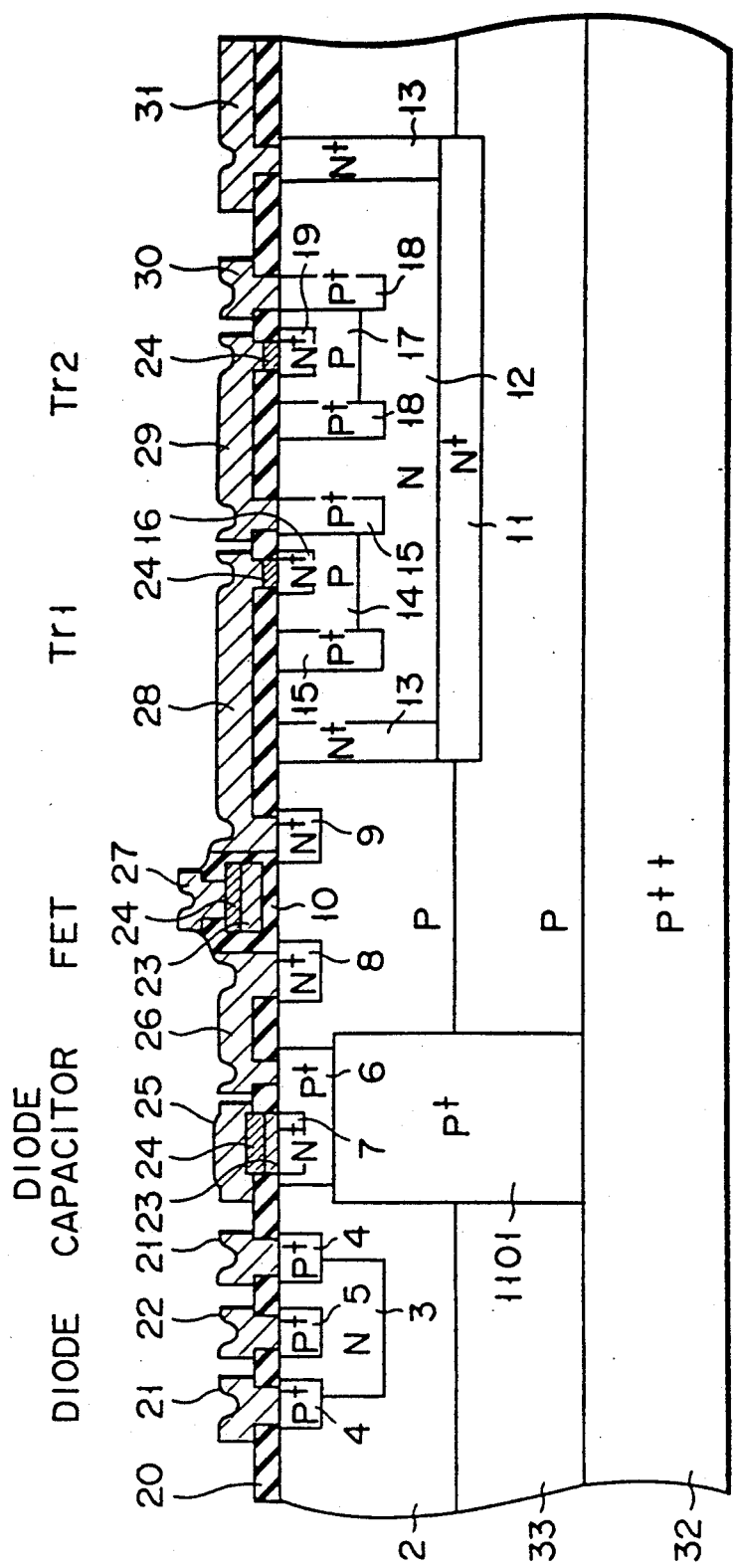
FIG. 4 is a sectional view of a third embodiment of the high-frequency amplifying semiconductor device of the present invention.

FIG. 4 illustrates a third embodiment of the present invention in which use is made of a wafer in which a collector N+ type buried layer 11 and P+ type buried layer 1101 are formed after the formation of first epitaxial layer 33 and then second epitaxial layer 2 is grown so as to connect source N+ type region 8 and P++ type Si substrate 32 through P+ type buried layer 1101. Buried layer 11 contains boron concentration of $1 \times 10^{18}$ cm$^{-3}$ to $4 \times 10^{18}$ cm$^{-3}$. First epitaxial layer 33 has a thickness of 25 $\mu$m to 35 $\mu$m and contains boron at concentration of $1 \times 10^{15}$ cm$^{-3}$ to $6 \times 10^{15}$ cm$^{-3}$.

According to the second and third embodiments of the present invention, the source resistance can be further reduced.

Figure 1:
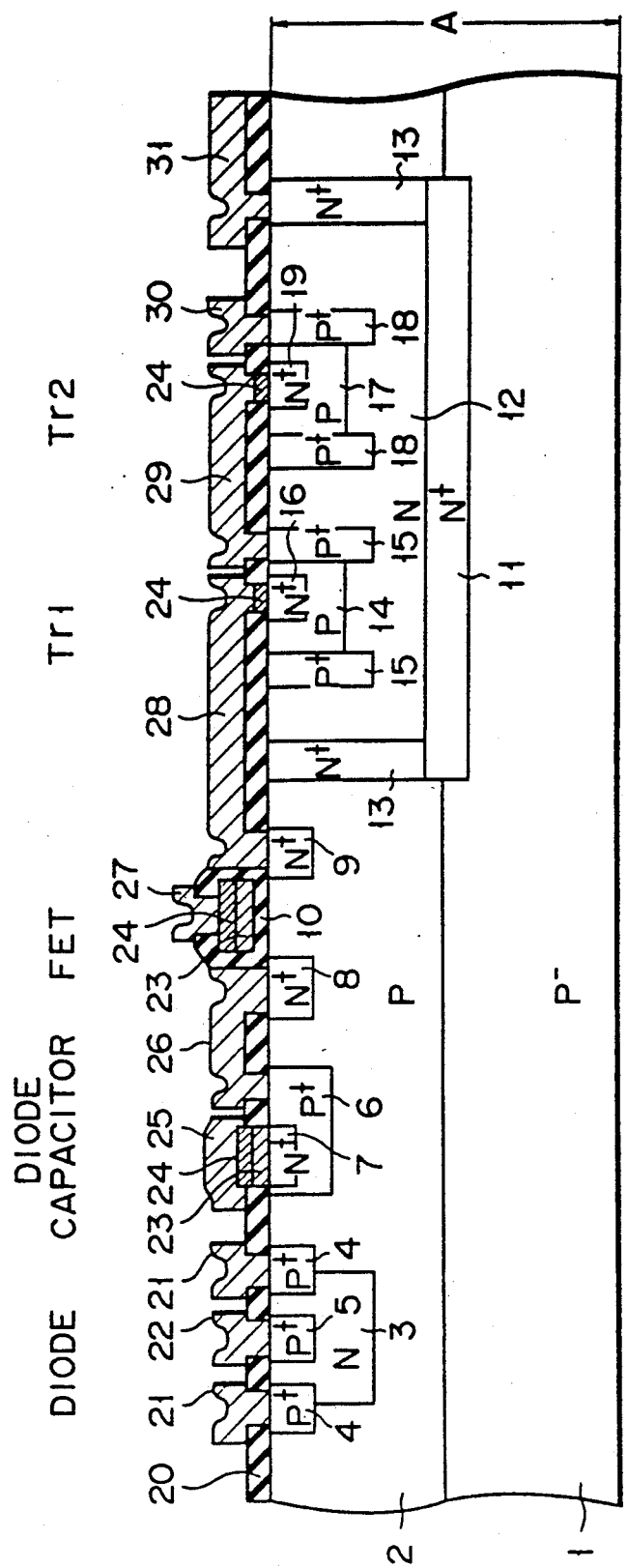
FIG. 1 is a sectional view of a conventional high-frequency amplifying semiconductor device.
Figure 5:
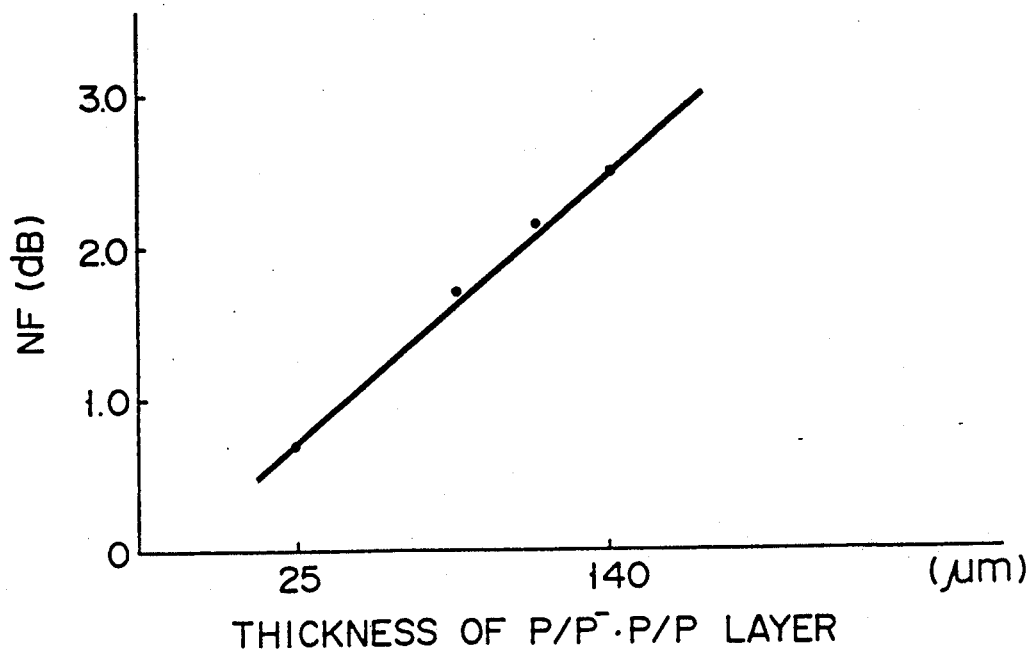
FIG. 5 illustrates noise the figure (NF) vs. thickness of P/P− layer or P/P layer characteristic of a high-frequency amplifying semiconductor device.
Figure 6:
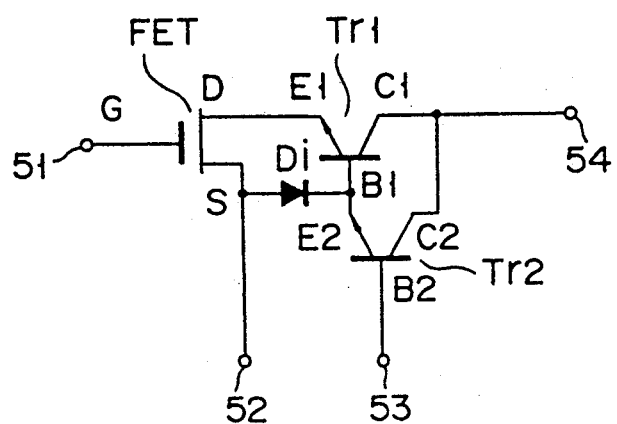
FIG. 6 is an equivalent circuit diagram of a high-frequency amplifying semiconductor device.

FIG. 5 illustrates the dependence of NF of a high-frequency amplifying semiconductor device upon the thickness of the P/P$^-$ layer or P/P layer. A good part of the source resistance of MOS field effect transistor depends upon the thickness of the P type or P$^-$ type layer. The thickness A of the P/P$^-$ layer of the conventional device of FIG. 1 is in the vicinity of 140 $\mu$m, while the thickness B of the P/P layer or P/P$^-$ layer in the device of the invention is, for example, about 25 $\mu$m. In the device of the present invention, the value of NF will be reduced by a factor of about three as compared with the conventional device.

As described above, in accordance with the present invention, in a high-frequency amplifying semiconductor device in which a MOS field effect transistor and a bipolar transistor are formed within the same wafer and a source electrode of the MOS field effect transistor is connected to a lead frame by a bonding wire, use is made of a wafer for fabricating the MOS field effect transistor and the bipolar transistor, in which on a semiconductor substrate of a first conductivity type which contains impurities at a high concentration is formed a first epitaxial layer of the first conductivity type which contains impurities at a concentration lower than that of the semiconductor substrate, a buried layer of a second conductivity type which contains impurities at a high concentration is formed in the first epitaxial layer of the first conductivity type and a second epitaxial layer of the first conductivity type which contains impurities at a lower concentration than the semiconductor substrate of the first conductivity type on the buried layer of the second conductivity type and the first epitaxial layer of the first conductivity type. The use of such a wafer as described above allows the source resistance of the MOS field effect transistor to be decreased. The present invention can therefore provide a high-frequency amplifying semiconductor device which is improved in high-frequency gain and NF.

What is claimed is:

1. A high-frequency amplifying semiconductor device comprising:
   a semiconductor substrate of a first conductivity type which is heavily doped with impurities;
   a first epitaxial layer of the first conductivity type formed on said semiconductor substrate of the first conductivity type and containing impurities at a lower concentration than said semiconductor substrate;
   a buried layer of a second conductivity type formed in said first epitaxial layer of the first conductivity type and heavily doped with impurities;
   a second epitaxial layer of the first conductivity type formed on said buried layer of the second conductivity type and said first epitaxial layer of the first conductivity type and containing impurities at a lower concentration than said semiconductor substrate of the first conductivity type, a portion of said second epitaxial layer above said buried layer being of second semiconductor type;
   an MOS field effect transistor formed in said second epitaxial layer of the first conductivity type and having a source electrode connected to a lead frame through a bonding wire;
   a diode capacitor formed in said second epitaxial layer of the first conductivity type and connected to said source electrode of said MOS field effect transistor; and
   a bipolar transistor formed in said second conductivity type portion of said second epitaxial layer of the first conductivity type.

2. A high-frequency amplifying semiconductor device according to claim 1, in which the impurity concentration of said first epitaxial layer of the first conductivity type is in the range from $1 \times 10^{15}$ cm$^{-3}$ to $6 \times 10^{15}$ cm$^{-3}$.

3. A high-frequency amplifying semiconductor device according to claim 1, in which the thickness of said first epitaxial layer of the first conductivity type is in the range of 25 μm to 35 μm.

4. A high-frequency amplifying semiconductor device comprising:
   a semiconductor substrate of a first conductivity type which is heavily doped with impurities;
   a first epitaxial layer of the first conductivity type formed on said semiconductor substrate of the first conductivity type and containing impurities at a lower concentration than said semiconductor substrate;
   a buried layer of a second conductivity type formed in said first epitaxial layer of the first conductivity type and heavily doped with impurities;
   a second epitaxial layer of the first conductivity type formed on said buried layer of the second conductivity type and said first epitaxial layer of the first conductivity type and containing impurities at a concentration which is higher than said first epitaxial layer and lower than said semiconductor substrate of the first conductivity type, a portion of said second epitaxial layer above said buried layer being of second semiconductor type;
   an MOS field effect transistor formed in said second epitaxial layer of the first conductivity type and having a source electrode connected to a lead frame through a bonding wire;
   a diode capacitor formed in said second epitaxial layer of the first conductivity type and connected to said source electrode of said MOS field effect transistor; and
   a bipolar transistor formed in said second conductivity portion of said second epitaxial layer of the first conductivity type.

5. A high-frequency amplifying semiconductor device according to claim 4, in which the impurity concentration of said first epitaxial layer of the first conductivity type is in the range from $3 \times 10^{14}$ cm$^{-3}$ to $6 \times 10^{14}$ cm$^{-3}$.

6. A high-frequency amplifying semiconductor device according to claim 4, in which the thickness of said first epitaxial layer of the first conductivity type is in the range of 20 μm to 30 μm.

7. A high-frequency amplifying semiconductor device comprising:
   a semiconductor substrate of a first conductivity type which is heavily doped with impurities;
   a first epitaxial layer of the first conductivity type formed on said semiconductor substrate of the first conductivity type and containing impurities at a lower concentration than said semiconductor substrate;
   a buried layer of a second conductivity type formed in said first epitaxial layer of the first conductivity type and heavily doped with impurities;
   a buried layer of the first conductivity type formed in said first epitaxial layer of the first conductivity type and heavily doped with impurities;
   a second epitaxial layer of the first conductivity type formed on said buried layer of the second conductivity type, said buried layer of the first conductivity type and said first epitaxial layer of the first conductivity type and containing impurities at a concentration which is lower than said semiconductor substrate of the first conductivity type, a portion of said second epitaxial layer above said buried layer being of second semiconductor type;
   an MOS field effect transistor formed in said second epitaxial layer of the first conductivity type and having a source electrode connected to a lead frame through a bonding wire;
   a diode capacitor formed in said second epitaxial layer of the first conductivity type and connected to said source electrode of said MOS field effect transistor; and
   a bipolar transistor formed in said second conductivity portion of said second epitaxial layer of the first conductivity type.

8. A high-frequency amplifying semiconductor device according to claim 7, in which the impurity concentration of said first epitaxial layer of the first conductivity type is in the range from $1 \times 10^{15}$ cm$^{-3}$ to $6 \times 10^{15}$ cm$^{-3}$.

9. A high-frequency amplifying semiconductor device according to claim 7, in which the thickness of said first epitaxial layer of the first conductivity type is in the range of 25 μm to 35 μm.

10. A high-frequency amplifying semiconductor device according to claim 7, in which the impurity concentration of said buried layer of the first conductivity type is in the range from $1 \times 10^{18}\,cm^{-3}$ to $4 \times 10^{18}\,cm^{-3}$.

11. A high frequency amplifying semiconductor device according to claim 7, comprising said buried layer of the first conductivity type extending through said second epitaxial layer and connected to a source region of said MOS field effect transistor.

12. A high frequency amplifying semiconductor device according to claim 8, comprising said buried layer of the first conductivity type extending through said second epitaxial layer and connected to a source region of said MOS field effect transistor.

13. A high frequency amplifying semiconductor device according to claim 9, comprising said buried layer of the first conductivity type extending through said second epitaxial layer and connected to a source region of said MOS field effect transistor.

14. A high frequency amplifying semiconductor device according to claim 10, comprising said buried layer of the first conductivity type extending through said second epitaxial layer and connected to a source region of said MOS field effect transistor.

* * * * *